United States Patent
Lee et al.

(10) Patent No.: US 9,780,781 B2
(45) Date of Patent: Oct. 3, 2017

(54) MULTI-ACTION CAPACITIVE SWITCH AND METHODS OF USE

(75) Inventors: Yun Sun Lee, Gurnee, IL (US); Chin Feng Hsu, Schamburg, IL (US)

(73) Assignee: BlackBerry Limited, Waterloo, Ontario (CA)

( * ) Notice: Subject to any disclaimer, the term of this patent is extended or adjusted under 35 U.S.C. 154(b) by 1204 days.

(21) Appl. No.: 12/892,113

(22) Filed: Sep. 28, 2010

(65) Prior Publication Data

US 2012/0075486 A1   Mar. 29, 2012

(51) Int. Cl.
| | |
|---|---|
| *H03K 17/94* | (2006.01) |
| *H03K 17/96* | (2006.01) |
| *G06F 3/023* | (2006.01) |
| *H04M 1/2745* | (2006.01) |

(52) U.S. Cl.
CPC ........... *H03K 17/962* (2013.01); *G06F 3/023* (2013.01); *H03K 2217/96054* (2013.01); *H04M 1/274525* (2013.01); *H04M 2250/22* (2013.01)

(58) Field of Classification Search
CPC .................................................... H03K 17/94
USPC .................... 341/33; 455/566; 348/207.99
See application file for complete search history.

(56) References Cited

U.S. PATENT DOCUMENTS

| | | | |
|---|---|---|---|
| 5,270,710 A | 12/1993 | Gaultier et al. | |
| 5,341,133 A | 8/1994 | Savoy et al. | |
| 6,204,839 B1 | 3/2001 | Mato | |
| 6,288,707 B1 | 9/2001 | Philipp | |
| 6,492,978 B1 | 12/2002 | Selig et al. | |
| 6,704,005 B2 | 3/2004 | Kato et al. | |
| 7,151,528 B2 | 12/2006 | Taylor et al. | |
| 7,279,647 B2 | 10/2007 | Philipp | |
| 2006/0050056 A1* | 3/2006 | Armstrong | 345/161 |
| 2006/0113178 A1 | 6/2006 | Soma et al. | |
| 2008/0024958 A1 | 1/2008 | Mudd et al. | |

(Continued)

FOREIGN PATENT DOCUMENTS

| | | |
|---|---|---|
| EP | 1 081 922 A2 | 3/2001 |
| JP | 2006-120184 | 11/2007 |
| WO | 2011/003555 | 1/2011 |

OTHER PUBLICATIONS

"Touch switch", Wikipedia, http://en.wikipedia.org/wiki/Touch_switch, Sep. 2, 2010 (2 pages).

(Continued)

*Primary Examiner* — Amine Benlagsir
(74) *Attorney, Agent, or Firm* — Fish & Richardson P.C.

(57) ABSTRACT

A multi-action capacitive switch comprising a capacitive sensing area in a surface, a plunger comprising conductive material, and a structure of flexible conductive material. A change in capacitance caused by the presence of a user's finger travels from the capacitive sensing area, down the conductive material of the plunger, over the structure, and to a capacitive touch detector in contact with the structure. An actuation of the switch, for example by pressing, is detected by an actuation detector. In a handheld electronic device, a user may initiate a phone call using such a multi-action capacitive switch. The method includes displaying a list of phone numbers in response to detection of a user's finger on a predetermined key and calling one of the numbers when the user actuates the predetermined key.

8 Claims, 8 Drawing Sheets

(56) References Cited

U.S. PATENT DOCUMENTS

| | | |
|---|---|---|
| 2008/0048997 A1* | 2/2008 | Gillespie ............. G06F 3/03547 |
| | | 345/174 |
| 2008/0100587 A1* | 5/2008 | Sano ....................... G06F 3/041 |
| | | 345/173 |
| 2009/0008234 A1 | 1/2009 | Tolbert et al. |
| 2009/0058802 A1* | 3/2009 | Orsley .......................... 345/157 |
| 2009/0128511 A1* | 5/2009 | Sinclair et al. ............... 345/174 |
| 2009/0135144 A1* | 5/2009 | Chuang et al. ............... 345/168 |
| 2009/0160682 A1 | 6/2009 | Bolender et al. |
| 2009/0179860 A1* | 7/2009 | Wang et al. .................. 345/168 |
| 2009/0273573 A1* | 11/2009 | Hotelling ..................... 345/173 |
| 2010/0079309 A1 | 4/2010 | Filson et al. |
| 2010/0309030 A1* | 12/2010 | Huang et al. ................... 341/33 |

OTHER PUBLICATIONS

"Capacitive sensing", Wikipedia, http://en.wikipedia.org/wiki/CapSense, Sep. 2, 2010 (3 pages).

"Capacitive Switches—Xycap Dccs Digitally Controlled Capacitive Switching," http://www.xymox.com/capacitive-switches.htm, Sep. 10, 2010 (3 pages).

Hinckley, Ken, et al., "Touch-Sensing Input Devices", ACM CHI'99 Conference on Human Factors in Computing Systems, 1999, pp. 223-230 (8 pages).

Extended European Search Report from the European Patent Office for corresponding EP Application No. 10180959.8, dated Mar. 30, 2011 (7 pages).

Communication Pursuant to Article 94(3) EPC issued in European Application No. 10180959.8 on Sep. 8, 2016.

* cited by examiner

MULTI-ACTION CAPACITIVE SWITCH AND METHODS OF USE

FIELD

This disclosure relates generally to handheld electronic devices and, more particularly, to a handheld electronic device including a capacitive switch and methods for employing the capacitive switch.

BACKGROUND INFORMATION

Numerous types of handheld electronic devices are known. Examples of such handheld electronic devices include, for instance, personal data assistants (PDAs), handheld computers, two-way pagers, cellular telephones, digital cameras, and the like. Although some handheld electronic devices are stand-alone devices, many feature wireless communication capability for communication with other devices.

Handheld electronic devices are generally intended to be portable, and thus are of a relatively compact configuration in which input structures such as keys may perform multiple functions under certain circumstances or may otherwise have multiple aspects or features assigned thereto. With advances in technology, handheld electronic devices are built to have progressively smaller form factors yet have progressively greater numbers of applications and features resident thereon. As a practical matter, the keys of a keypad can only be reduced to a certain small size before the keys become relatively unusable. Furthermore, due to the limited number of keys and the increasing number of features available on the device, access to these features may be buried under multiple layers of menus making use of the features cumbersome.

Many handheld electronic devices use mechanical keys that allow a user to feel the actuation of a key. Users feel comfortable with the feel of these keys and device manufacturers have spent large amounts of money to design and implement production lines to produce these keys. Many users would not want to switch to a key displayed as part of a touch screen and manufacturers would not be willing to make large scale changes to production lines to accommodate widely divergent mechanical keys.

BRIEF DESCRIPTION OF THE DRAWINGS

The accompanying drawings, which are incorporated in and constitute a part of this specification, illustrate several embodiments and, together with the description, serve to explain the disclosed principles. In the drawings.

DETAILED DESCRIPTION

Disclosed embodiments provide a multi-action capacitive switch device that a handheld electronic device may employ as a key or other button. In one exemplary embodiment, the multi-action switch comprises a surface with a capacitive sensing area and a plunger comprising a conductive material. The conductive material of the plunger is in contact with the capacitive sensing area so that a change in capacitance sensed by the capacitive sensing area is transferred down the conductive material. The device may further include a structure fabricated from flexible conductive material in contact with the conductive material of the plunger. The structure, which may be dome-shaped, contacts a capacitive touch detector and, when the switch is actuated by a user, the plunger causes the structure to contact an actuation detection detector.

In other disclosed embodiments, a method is provided for placing a phone call using a mobile communication device, the mobile communication device comprising an input apparatus, an output apparatus, a memory, and a processor, and the input apparatus comprising a plurality of keys, at least one of which comprises a capacitive switch input member. The method includes detecting a change in capacitance at the input member. The method further includes, in response to detecting the capacitance change, causing the output apparatus to display a plurality of phone numbers, wherein one of the plurality of phone numbers is marked for selection. The method may further include detecting an actuation of the input member and, in response, causing the mobile communication device to place a call to the one of the plurality of phone numbers marked for selection.

Consistent with other disclosed embodiments, a method of using a capacitive switch in a handheld device is provided. The handheld device includes a camera, an input apparatus, an output apparatus, a memory, and a processor, and the input apparatus comprises a capacitive switch input member. The method includes detecting a capacitance change at the capacitive switch input member and, in response, causing the camera to initiate a focus function. The method may further include detecting an actuation of the capacitive switch input member causing the camera to take a picture.

It is to be understood that both the foregoing general description and the following detailed description are exemplary and explanatory only and are not restrictive of the disclosed embodiments, as claimed.

Reference will now be made in detail to exemplary embodiments, examples of which are illustrated in the accompanying drawings. Wherever convenient, the same reference numbers will be used throughout the drawings to refer to the same or like parts.

Figure 1:
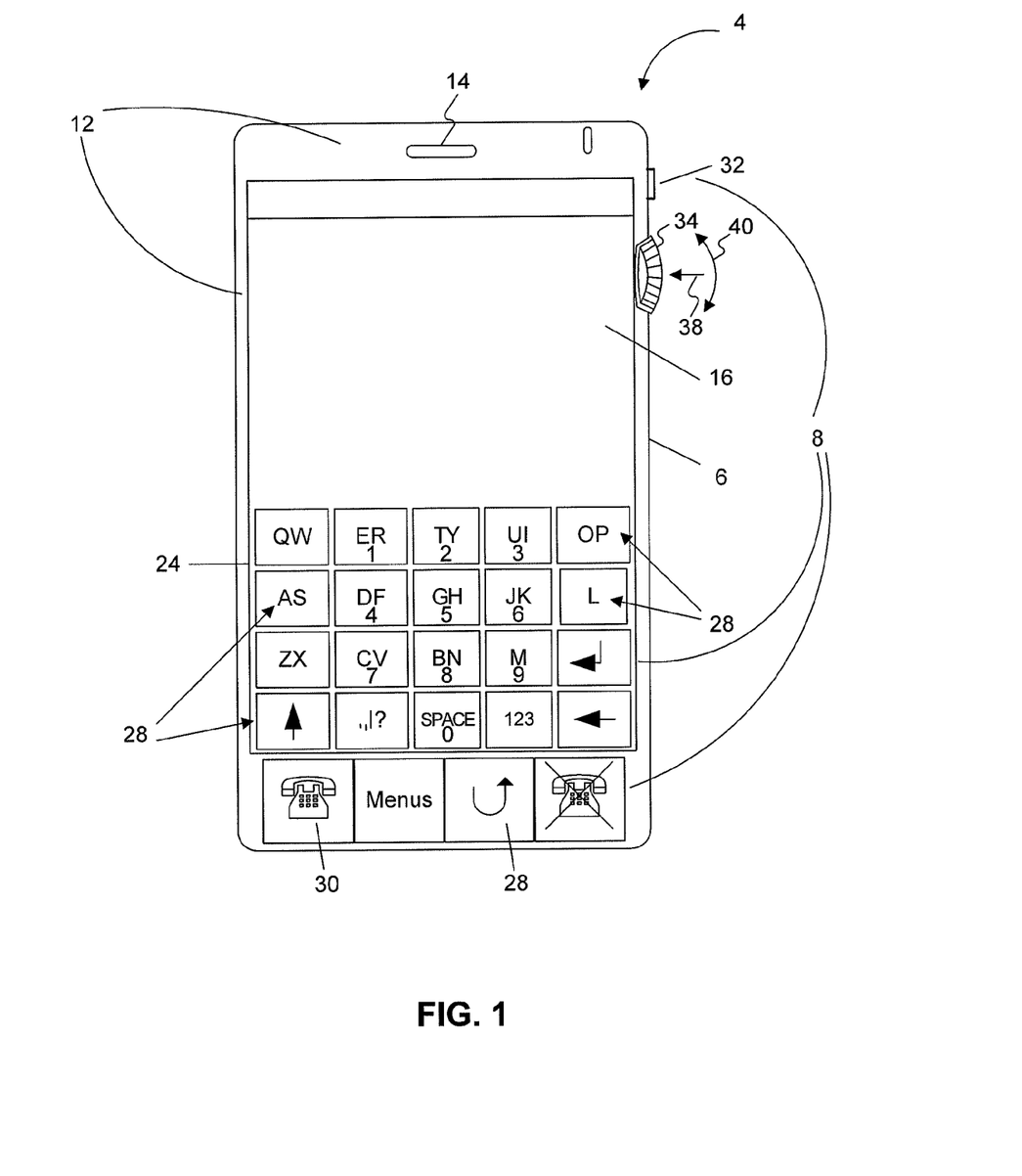
FIG. 1 is a top plan view of an improved handheld electronic device, consistent with disclosed embodiments.
Figure 2:
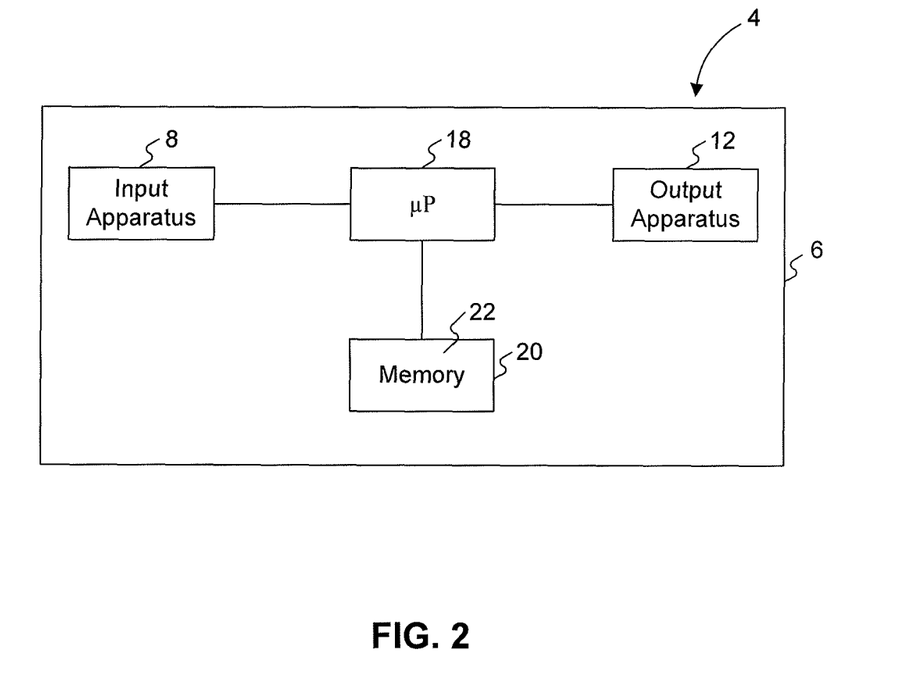
FIG. 2 is a schematic depiction of the handheld electronic device of FIG. 1.

A handheld electronic device 4 is indicated generally in FIG. 1 and is depicted schematically in FIG. 2. Exemplary handheld electronic device 4 may include housing 6 in which is disposed a processor unit that may include input apparatus 8, output apparatus 12, processor 18, and memory 20 for storing at least routine 22. Processor 18 may be, for instance, and without limitation, a microprocessor (µP) and may be responsive to input signals from input apparatus 8 and may provide output signals to output apparatus 12. Processor 18 may also interface with memory 20 and may be capable of executing routine 22. Examples of handheld electronic devices are included in U.S. Pat. No. 6,452,588, U.S. Pat. No. 6,873,317, and U.S. Pat. No. 6,489,950, which are incorporated by reference herein.

As can be understood from FIG. 1, output apparatus 12 may include display 16 and speaker 14, each of which may be responsive to one or more output signals from processor 18. Input apparatus 8 may include keypad 24, button 32, and scroll wheel 34. Keypad 24 is in the exemplary form of a QWERTY keyboard including a plurality of keys 28 that serve as input members. Keys 28 are disposed on a front face of housing 6, and button 32 may be disposed at a side of housing 6. Button 32 can serve as another input member providing input to processor 18. Scroll wheel 34 may be a rotatable thumbwheel that provides other input to processor 18. For example, scroll wheel 34 may provide one input to processor 18 when rotated in the direction represented by arrow 40 and a second input to processor 18 when actuated in the direction represented by arrow 38. Scroll wheel 34 may also be a ball or an optical trackpad and may be located on the face of handheld electronic device 4.

A number of keys 28 or other input members may function as a multi-action switches, such as key 30 and button 32. As employed herein, the expression "a number of" and variations thereof shall refer broadly to any non-zero quantity, including a quantity of one. Generally speaking, the handheld electronic device 4 is structured such that the processor 18 recognizes a different input from input members functioning as a multi-action switch, such as key 30, based on whether a user is touching the key, actuating the key, or tapping the key. For example, when a user desires to make a phone call, the user may place a finger on key 30. Processor 18 may be instructed to display a list of phone numbers in response to this input. When the user actuates key 30, processor 18 may be instructed to place a call to one of the phone numbers.

Memory 20 can be any one or more of a variety of types of internal or external storage media such as, without limitation, RAM, ROM, EPROM(s), EEPROM(s), and the like that provide a storage register for data storage such as in the fashion of an internal storage area of a computer, and can be volatile memory or nonvolatile memory. Memory 20 may include a number of routines depicted generally with the numeral 22 for the processing of data. The routines 22 can be in any of a variety of forms such as, without limitation, software, firmware, and the like. As will be explained in greater detail below, the routines 22 may include a camera application, a phone book application, as well as other routines.

Figure 3:
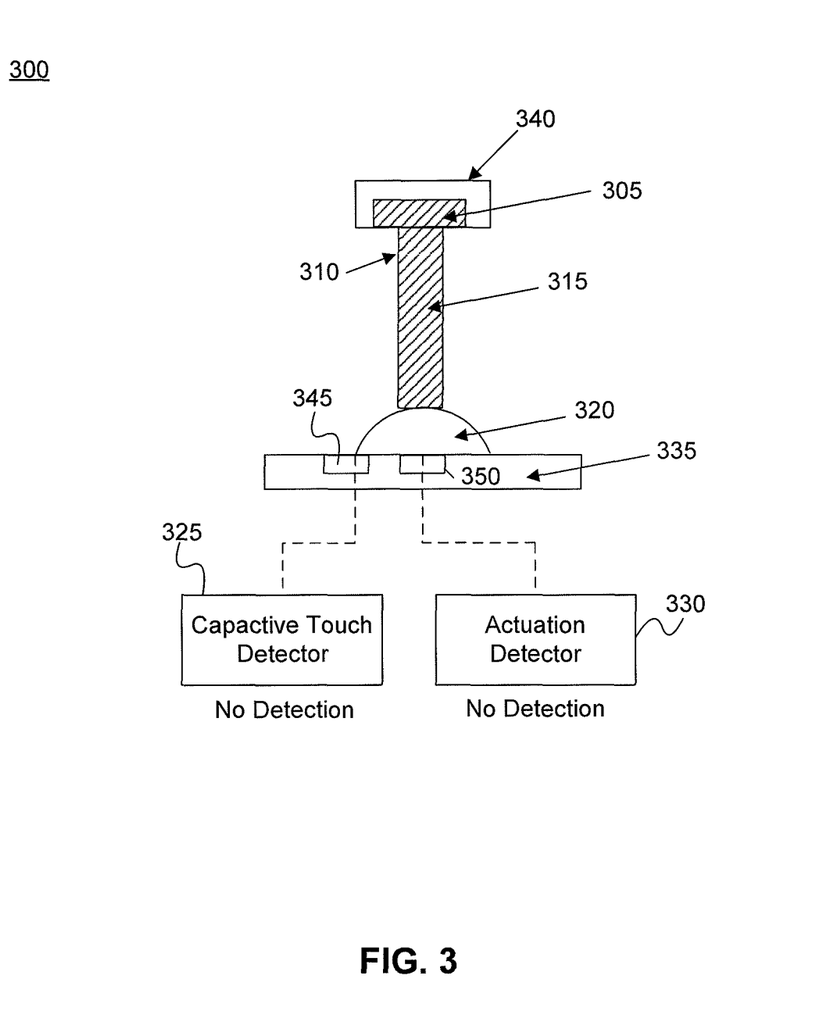
FIG. 3 is an exemplary capacitive switch, consistent with disclosed embodiments.

FIG. 3 is an exemplary capacitive switch 300, consistent with disclosed embodiments. Capacitive switch 300 makes novel improvements on mechanical actuation input devices, such as key 30 and button 30 of FIG. 1, providing a cost-effective switch capable of producing multiple inputs with a minimal number of components. As shown in FIG. 3, switch 300 includes surface 340 with capacitive sensing area 305. Surface 340 may be a key face, a button, a pad, or other surface identifying the switch. Capacitive sensing area 305 may include any conductive material. Examples include, but are not limited to, metals such as silver and copper, graphite, anti-static conductive foam, and plasmas. Surface 340 and capacitive sensing area 305 may be connected to plunger 310. In certain embodiments plunger 310 may be one piece comprised of conductive path 315. In other embodiments plunger 310 may have a non-conductive material housing conductive path 315. Conductive path 315 may be made from any of the conductive materials described above. Conductive path 315 may be made of the same material as capacitive sensing area 305 or it may be made of a different material. In some embodiments, capacitive sensing area 305 and conductive path 315 may comprise a single molded piece made of a single conductive material.

Conductive path 315 may transmit a change in capacitance sensed by area 305 to flexible structure 320. Structure 320 is shown in FIG. 3 as having a dome configuration, although other configurations may be possible including, but not limited to, an arch, a flattened cone, or a box. Structure 320 may be constructed of any flexible conductive material. For example, structure 320 may be metal or structure 320 may be another flexible material coated with metal. Structure 320 may contact conductive path 315 and capacitive touch detector 325. Capacitive touch detector 325 may be implemented using an integrated circuit, discrete circuitry, an A/D converter, a processor input port etc. In some embodiments, structure 320 may contact capacitive touch detector 325 through pad 345. Pad 345 may include a button, pad, or other switch that detects the collapse of structure 320. In other embodiments, structure 320 may sit atop a ring of conductive material (not shown). The ring may enable structure 320 to transmit a change in capacitance to detector 325. Capacitive touch detector 325 may be located on or connected to printed circuit board 335 and may receive and process a change in capacitance transferred from sensing area 305.

Switch 300 may also include actuation detector 330. Actuation detector 325 may be implemented using an integrated circuit, discrete circuitry, an A/D converter, a processor input port etc. When plunger 310 causes structure 320 to collapse, structure 320 may connect with actuation detector 330, thus completing an electrical circuit. In some embodiments, structure 320 may connect with actuation detector 330 through pad 350. Pad 350 may include a button, pad, or other switch that detects the collapse of structure 320. Alternatively, the inside of structure 320 may sit atop a portion of printed circuit board 335 that has an interleaving comb pattern. When plunger 310 causes structure 320 to collapse, structure 320 may make contact with the interleaving comb pattern causing actuation detector 330 to detect the collapse. Actuation detector 330 may be located on or connected to printed circuit board 335 and may receive and process the actuation of structure 320. It should be noted that although actuation detector 330 and capacitive touch detector 325 are shown in FIG. 4 as separate detectors, the functionality of these devices may be implemented as a single integrated circuit or may be incorporated into an integrated circuit containing additional functions, such as but not limited to, processor 18.

Figure 4:
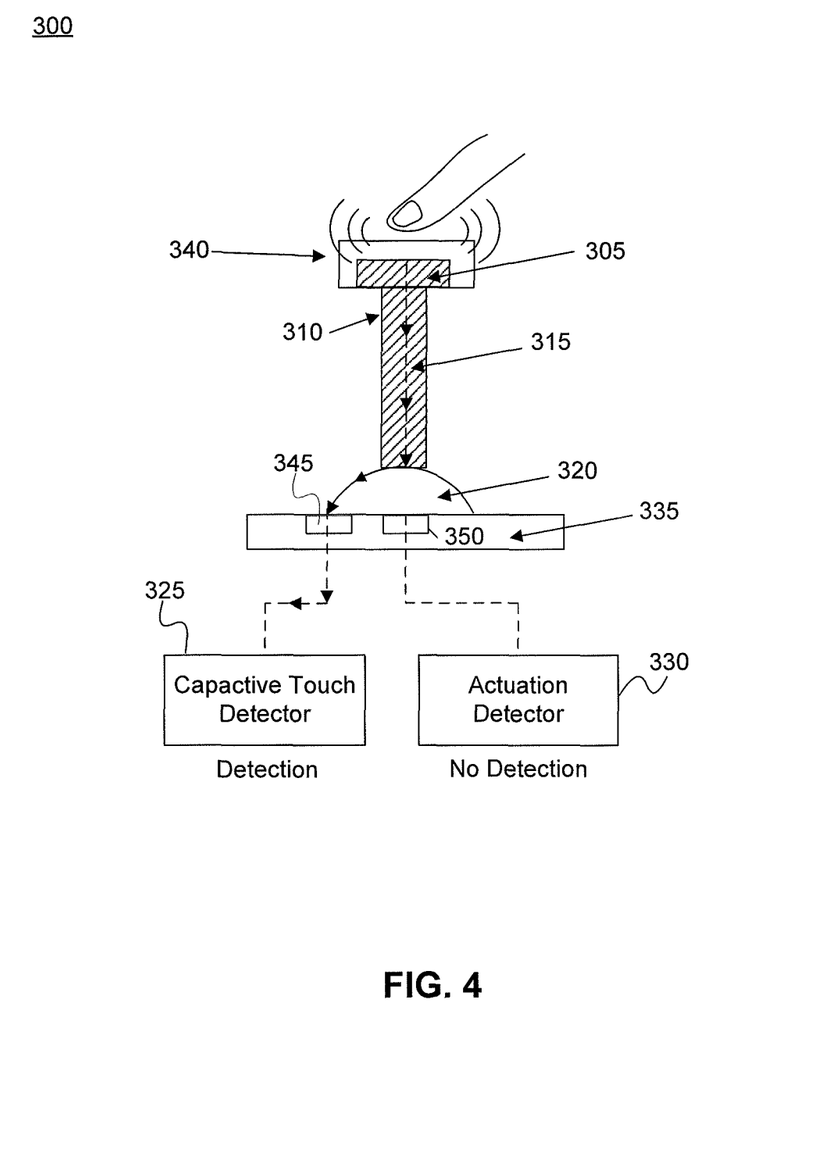
FIG. 4 is an exemplary capacitive switch detecting a touch, consistent with disclosed embodiments.

FIG. 4 is an exemplary capacitive switch detecting a touch, consistent with disclosed embodiments. For example, because a finger is conductive, when the user's finger or other body part comes close to or touches surface 340 of the switch, capacitive sensing area 305 may detect a change in capacitance due to the presence of the finger. The change in capacitance may travel through conductive material 315, down to structure 320, finally being transmitted to capacitive touch detector 325. Capacitive touch detector 325 may contain circuitry that determines whether the change in capacitance received from structure 320 is large enough to qualify as a user's finger coming near or touching surface area 340 of switch 300. If the change in capacitance is large enough to constitute a touch of switch 300, capacitive touch detector 325 may communicate this as an input to processor

18. Processor 18 may be structured to run a function in routine 22 when it receives the capacitive touch input.

In certain disclosed embodiments, when the change in capacitance is large enough to constitute a touch, processor 18 may determine the length of the touch. For example, processor 18 may treat a short touch, such as a tap, as one type of input and may treat a longer touch as a different type of input. In other embodiments, capacitive touch detector 325 may contain circuitry that determines the length of the touch and sends an indication of a first type of input to processor 18 for a touch and an indication of a second type of input to processor 18 for a shorter tap.

Figure 5:
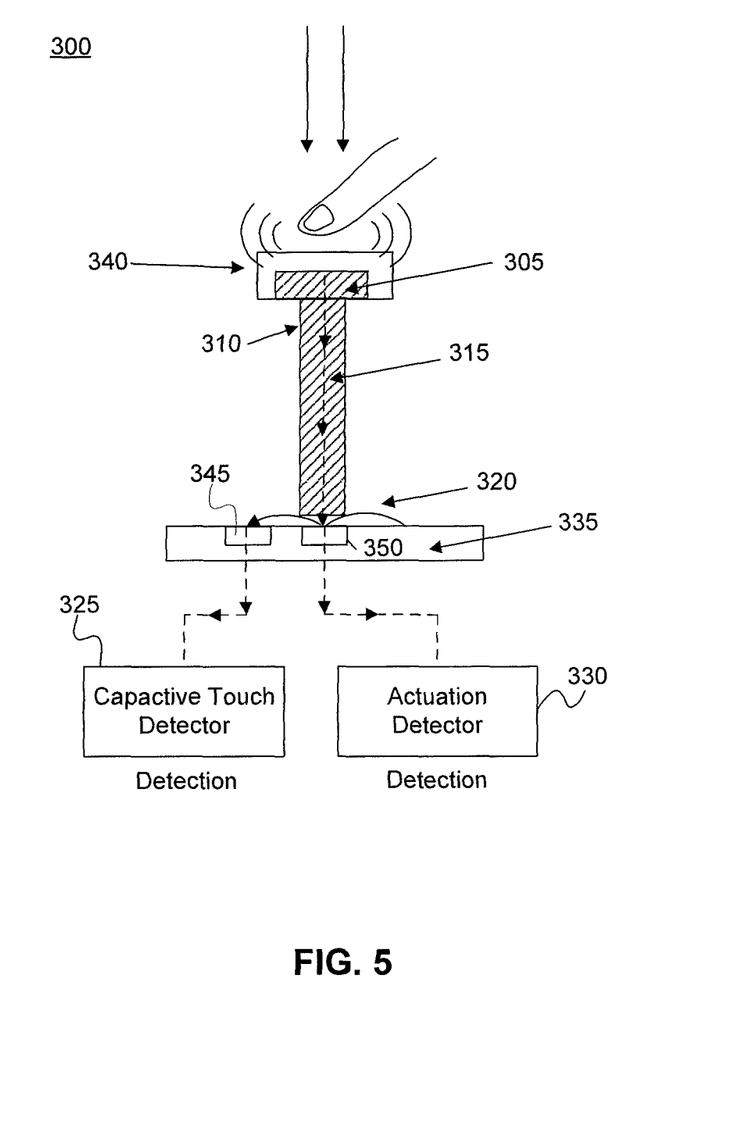
FIG. 5 is an exemplary capacitive switch during actuation, consistent with disclosed embodiments.

FIG. 5 is an exemplary dual action switch during actuation, consistent with disclosed embodiments. When a user presses down on surface area 340, plunger 310 may cause structure 320 to collapse, actuating switch 300. When collapsed, structure 320 may contact actuation detector 330. Detector 330 may communicate connection with structure 320 directly to processor 18 as an actuation input. Thus, processor 18 may receive a third input from switch 300. In certain disclosed embodiments, processor 18 may only recognize an actuation of switch 300 when it receives an capacitive touch input from detector 325 and an actuation input from detector 330. In this manner, processor 18 may ignore an accidental actuation of switch 300, for example, when a pen in a briefcase or a purse accidently actuates the key.

Figure 6:
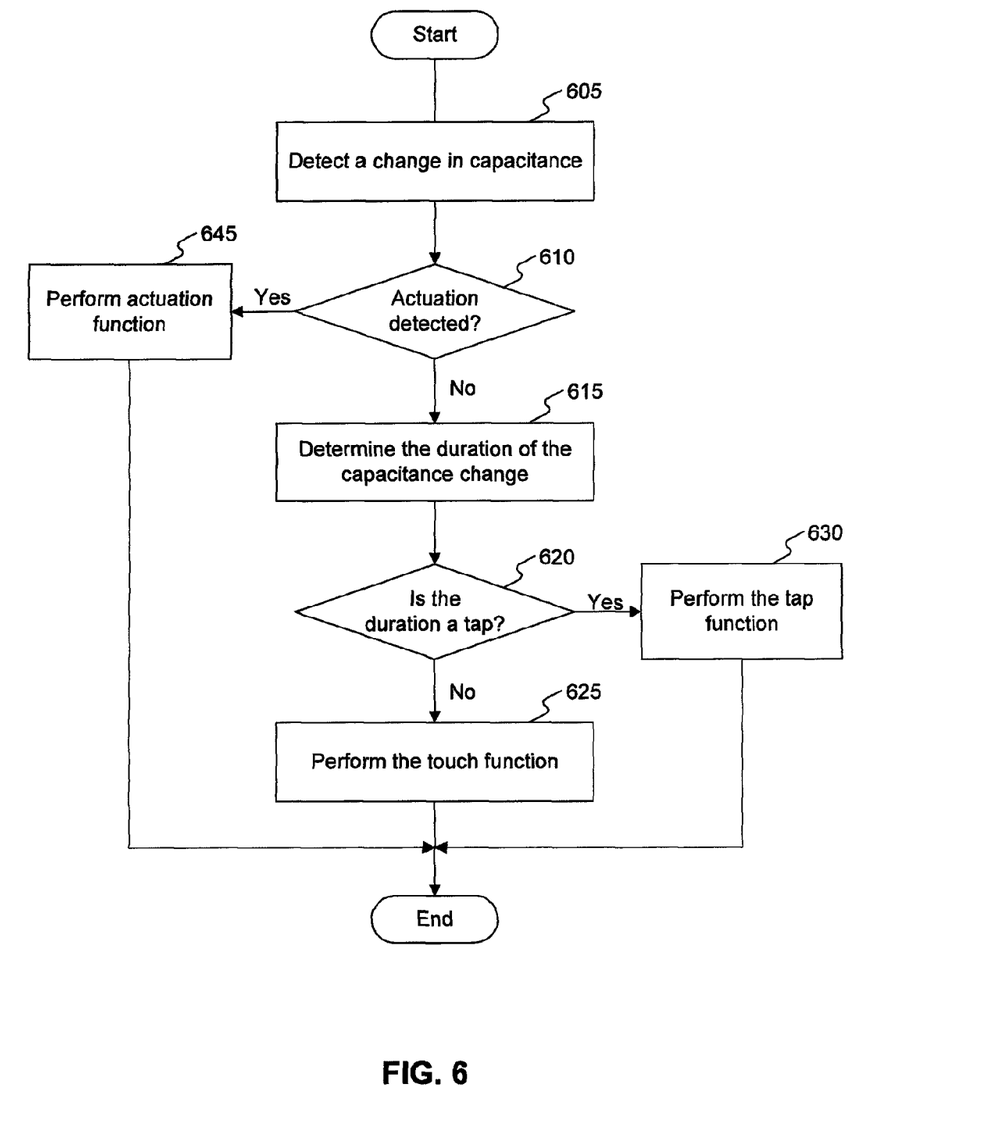
FIG. 6 is an exemplary flowchart illustrating the implementation of a multi-action capacitive switch, consistent with disclosed embodiments.

FIG. 6 is an exemplary flowchart of the implementation of a multi-action capacitive switch, consistent with disclosed embodiments. The flowchart demonstrates how capacitive switch 300 may initiate three distinct functions using processor 18. The flowchart may be called from a function that waits for user input and would return to the wait state after completion. In step 605, capacitive touch detector 325 may detect a change in capacitance caused, for example, by a user touching surface 340. Next, processor 18 may determine that no actuation of switch 300 has occurred (step 610, No). In step 615, processor 18 may determine the duration of the capacitance change. In alternate embodiments, capacitive touch detector 325 may determine the duration and send the duration to processor 18. If the duration is longer than a tap (step 620, No), then in step 625, processor 18 may initiate a touch function. A touch function may, for example, cause a list of phone numbers to be displayed by an output apparatus, or may focus a picture, but may also include any other function suitable for detection of a touch input at capacitive switch 300.

If the duration is short enough to qualify as a tap (step 620, Yes), then in step 630, processor 18 may initiate a tap function. A tap function may be changing the item marked for selection in a list of items, turning a flash on or off, but can be any other function suitable for detection of a tap input. If processor 18 detects an actuation of capacitive switch 300 after detecting the change in capacitance (step 610, Yes), then processor 18 may perform an actuation function. An actuation function may be calling a selected phone number, taking a picture, or any other function suitable for detection of an actuation input at capacitive switch 300. FIG. 6 indicates processor 18 would not recognize an actuation of capacitive switch 300 without detecting a change in capacitance. However, disclosed embodiments are not limited to any particular order. In some embodiments, an actuation of switch 300 may be detected regardless of detecting an associated change in capacitance. In other embodiments, processor 18 may not perform the actuation function until after performance of the touch function.

Figure 7:
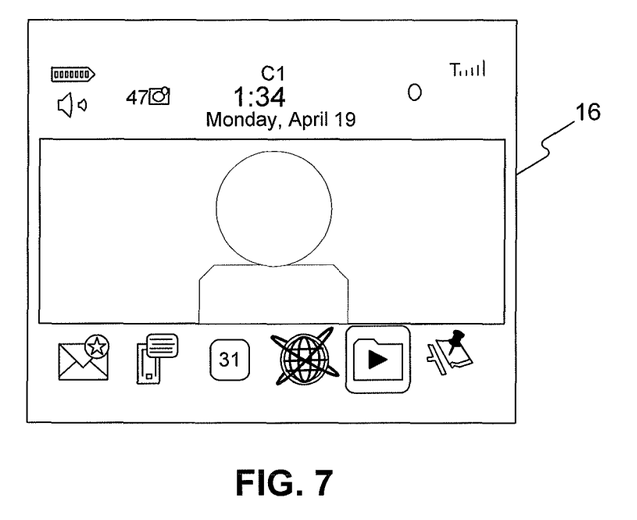
FIG. 7 is an exemplary default output of an improved handheld electronic device, consistent with disclosed embodiments.
Figure 8:
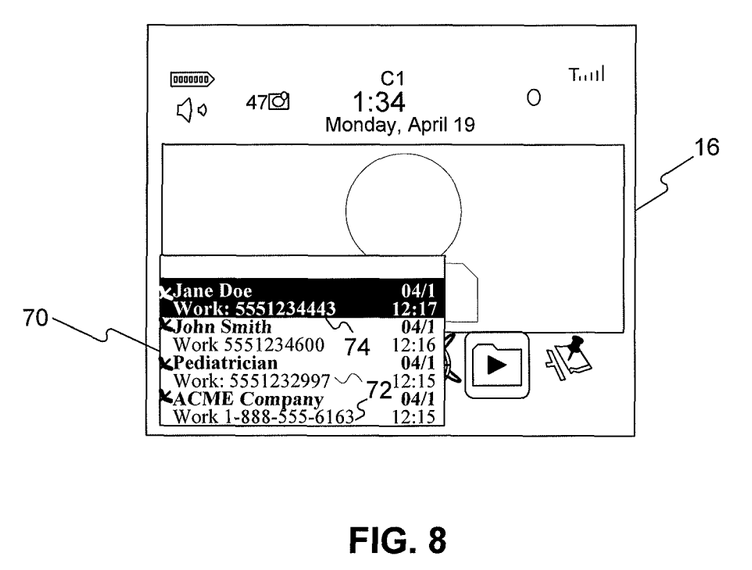
FIG. 8 is an exemplary output of an improved handheld electronic device after detection of a capacitance change at a capacitive switch, consistent with disclosed embodiments.

An exemplary method of using a capacitive switch follows. Although the method is described using switch 300, this is for exemplary purposes only. Any capacitive button, pad, or switch that can detect a change in capacitance and an actuation may be used. FIG. 7 shows an exemplary default output of a handheld electronic device. FIG. 7 may represent the main or home screen of the output of the device. For example, display 16 may represent what the device presents to the user before the user provides input to the device. FIG. 8 shows an exemplary output of the device after detection of a capacitance change at capacitive switch 300, such as key 30 of FIG. 1. When processor 18 receives an input indicating of a change of capacitance at key 30, for example, due to a finger touching key 30, processor 18 may cause display 16 to display window 70. Window 70 may overlap some portion of display 16 and contain one or more phone numbers 72. Phone numbers 72 may include phone numbers representing recently received phone calls, recently placed phone calls, or phone numbers in a favorites directory. Window 70 may also include a phone number marked for selection, such as phone number 74. Window 70 may indicate a phone number marked for selection by a visual indication, such as an icon located next to the phone number, a phone number displayed in a different color, or highlighting the phone number. Phone number 74 exemplifies such highlighting, but disclosed embodiments are not limited to any particular method of highlighting or any particular visual indication. Displaying window 70 may be an example of a touch function described with regard to step 625 of FIG. 6.

With window 70 appearing on display 16, processor 18 may receive an indication that the user has actuated key 30, for example, by pressing down on the key. When processor 18 receives this indication, processor 18 may initiate a phone call to phone number 74 in window 70. Initiating the phone call may cause display 16 to present the display a user would see if the user had dialed the phone number manually and pressed the send key. Such a phone call initiation may involve running one or more functions in routine 22. Placing a phone call may be an example of an actuation function described with regard to step 645 of FIG. 6.

Figure 9:
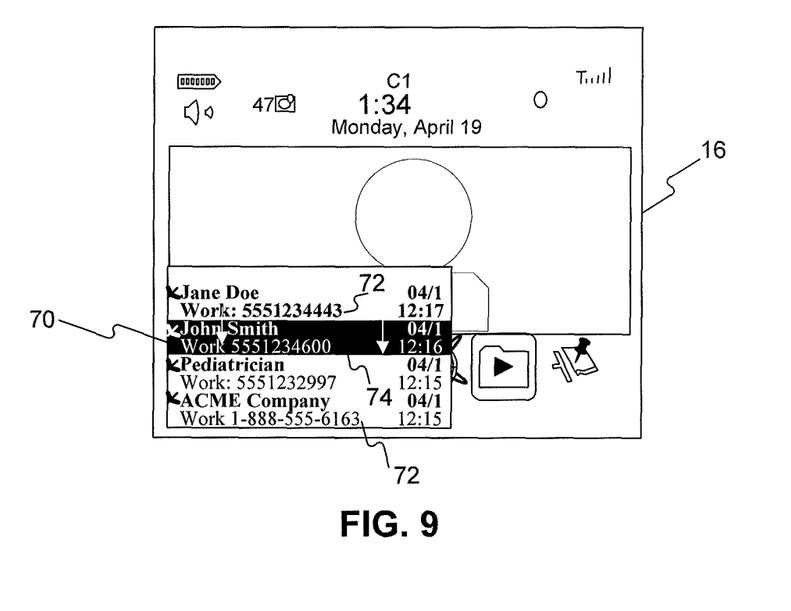
FIG. 9 is an exemplary output of an improved handheld electronic device after detection of a tap of a capacitive switch, consistent with disclosed embodiments.

In some embodiments, a user may change the phone number marked for selection using input apparatus 8. For example, a user may actuate an up or down arrow, or rotate scroll wheel 34 located in the side of housing 6. In other embodiments, a user may change the phone number marked for selection by tapping on the capacitive switch 300 that initiated the display of the phone numbers, such as key 30 in FIG. 1. For example, after processor 18 has detected a touch of key 30 and caused display 16 to present window 70, a user may tap key 30 one time. Processor 18 may receive an indication of the tap and, in response, cause the phone number marked for selection to move down one phone number, as shown in FIG. 9. Additional taps on key 30 may cause the phone number marked for selection to move down to the next phone number. In this manner, a user may use key 30 to bring up window 70 and to scroll through the phone numbers displayed in window 70. In certain embodiments window 70 may remain on display 16 until a user actuates a key not used to scroll through the phone numbers or actuates the send key. Changing the phone number marked for selection in window 70 may be an example of a tap function described with regard to step 630 of FIG. 6.

Another exemplary method of using a capacitive switch follows. Although the method is described using switch 300, this is for exemplary purposes only. Any capacitive button, pad, or switch that can detect a change in capacitance and an actuation may be used. Device 4 may include a camera function. A handheld electronic device could also be a camera. When a camera function is included in device 4, input apparatus 8 may include capacitive switch 300 for taking a photograph when device 4 is in camera mode. Capacitive switch 300 may be, for example, button 32 of FIG. 1. When device 4 is in camera mode and the processor detects a change in capacitance at button 32 due to, for example, a user touching button 32, processor 18 may initiate an auto-focus function. The auto-focus function may be one of the functions in routine 22 and an example of step 625. Thus, the device may focus the camera lens simply in response to the user placing a finger on button 32. When the user actuates button 32, processor 18 may cause the camera to take a picture. Taking a picture may be an example of an actuation function described with regard to step 645 of FIG. 6. In certain embodiments a tap of button 32 may cause processor 18 to turn a camera flash on, and a second tap may cause processor 18 to turn the camera flash off. In other embodiments, a tap may cause the camera to adjust the angle of view to zoom into the picture. Changing the camera flash mode (i.e. turning the flash on and off) and adjusting the angle of view may be examples of a tap function described in regard to step 630 of FIG. 6.

As described above, it is desirable to provide an improved handheld electronic device with a capacitive switch that enables a user to more quickly access desired functions without increasing the number of keys on the keyboard, having to wade through menu selections, or requiring manufacturers to completely redesign production lines. Such a handheld electronic device might employ one more actuation keys to act as dual or triple-action switches. The keys may perform different functions depending on whether a user has a finger on the key, has tapped the key, or has actually actuated the key, but may still retain the feel of a mechanically actuated key.

While specific embodiments have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed and claimed concept which is to be given the full breadth of the claims appended and any and all equivalents thereof.

What is claimed is:

1. A multi-action capacitive switch device, comprising:
   a surface comprising a capacitive sensing area and attached to a top portion of a plunger, the capacitive sensing area configured to detect a change in capacitance due to a presence of a finger;
   the plunger comprising a conductive material, a top portion of the conductive material in contact with the capacitive sensing area;
   a structure of flexible conductive material in contact with a bottom portion of the conductive material of the plunger;
   a capacitive touch detector, the capacitive touch detector configured to detect the change in capacitance that transfers from the capacitive sensing area, down the conductive material, and to the structure of flexible conductive material;
   an actuation detector,
   wherein in a first configuration the structure of flexible conductive material is physically connected to the capacitive touch detector and generates a first input signal, and when the device is actuated, the plunger causing the structure of flexible conductive material to be in a second configuration to generate a second input signal, which is physically connected to the actuation detector; and
   a processor, wherein the processor is configured to:
   detect the first input signal;
   in response to said detecting the first input signal, determining whether the second input signal is detected;
   when both the first and the second input signals are detected, execute an actuation function;
   when the first input signal is detected and the second input signal is not detected: determining a duration of the change in capacitance associated with the first input signal;
   comparing the duration of the change in capacitance with a threshold;
   determining, based on the comparing, whether to execute a touch function or a tap function;
   when the duration is longer than the threshold, execute the touch function; and
   when the duration is not longer than the threshold, execute the tap function.

2. The device of claim 1, wherein the capacitive sensing area detects a touch and transfers the change in capacitance down the conductive material to the structure of flexible conductive material, and the structure of flexible conductive material transfers the change in capacitance to the capacitive touch detector.

3. The device of claim 1, wherein the plunger further comprises a nonconductive material housing the conductive material.

4. The device of claim 1, wherein the capacitive sensing area and the conductive material are a molded piece.

5. The device of claim 1, wherein the structure of flexible conductive material has a dome configuration.

6. The device of claim 5, wherein a ring of the conductive material connects the dome configuration to the capacitive touch detector.

7. The device of claim 1, wherein the flexible conductive material of the structure of flexible conductive material is metal.

8. The device of claim 1, wherein the capacitive touch detector and the actuation detector are located on or connected to a single printed circuit board.

* * * * *